United States Patent [19]

Rader

[11] Patent Number: 4,794,556

[45] Date of Patent: Dec. 27, 1988

[54] METHOD AND APPARATUS FOR SAMPLING IN-PHASE AND QUADRATURE COMPONENTS

[75] Inventor: Charles M. Rader, Concord, Mass.

[73] Assignee: Massachusetts Institute of Technology, Cambridge, Mass.

[21] Appl. No.: 652,297

[22] Filed: Sep. 19, 1984

[51] Int. Cl.⁴ .................................................. G06F 7/38
[52] U.S. Cl. .................................................. 364/724.17
[58] Field of Search .......................................... 364/724

[56] References Cited

U.S. PATENT DOCUMENTS

| | | | |
|---|---|---|---|
| 4,125,866 | 11/1978 | van Essen et al. ................. | 364/724 |
| 4,184,129 | 1/1980 | Macchi nee Danjon et al. .... | 364/724 |
| 4,216,463 | 8/1980 | Backof, Jr. et al. ................ | 364/724 |
| 4,247,940 | 1/1981 | Mueller et al. ..................... | 375/16 |
| 4,344,040 | 8/1982 | Reilly et al. . | |
| 4,393,456 | 7/1983 | Marshall, Jr. ...................... | 364/724 |
| 4,435,773 | 3/1984 | Göckler et al. ..................... | 364/724 |
| 4,475,211 | 10/1984 | Mattis, Jr. et al. ................. | 364/724 |
| 4,489,418 | 12/1984 | Mazo .................................. | 375/27 |
| 4,519,084 | 5/1985 | Langseth ............................ | 364/724 |
| 4,534,043 | 8/1985 | Krishnan ............................ | 364/724 |
| 4,665,494 | 5/1987 | Tanaka et al. ..................... | 364/724 |

FOREIGN PATENT DOCUMENTS 2125246 2/1984 United Kingdom ................ 364/724

OTHER PUBLICATIONS

Jackson et al., "An Approach to the Implementation of Digital Filters", *IEEE Trans. Audio and Electroacoustics*, vol. AV #16, #3, pp. 413–421, Sep. 1968.

Esteban, "Direct Form Digital Filter Using Floating Point Arithmetic", *IBM Tech. Disclosure Bulletin*, vol. 15, #8, pp. 2529–2530, Jan. 1973.

Thirion, "Multiplex Digital Filtering Technique", *IBM Tech. Disclosure Bulletin*, vol. 16, #12, pp. 3942–3943, May 1974.

Nussbaumer, "Discrete Transforms Filter", *IBM Tech. Disclosure Bulletin*, vol. 18, #12, pp. 4048–4053, May 1976.

Mitra et al., "On the Implementation of a Two-Dimensional FIR Filter Using a Single Multiplier", *IEEE Trans. on Computers*, vol. C-27, #8, pp. 762–764, Aug. 1978.

Vopni et al., "A CMOS Time-Multiplexed Digital Filter for Vocoder Applications", *Can. Elec. Eng. J.*, vol. 7, #1, pp. 30–35, 1982.

Bernard Gold and Joseph Tierney, "Digitized Voice-Excited Vocoder for Telephone-Quality Inputs, Using Bandpass Sampling of the Baseband Signal," *The Journal of Acoustical Society of America*, vol. 37, No. 4, 753–754, Apr. 1965.

R. Boite and H. Leich, "The Digital Channel Bank", *PROC. IEE*, vol. 122, No. 4, pp. 340–344, Apr. 1975.

Bernard Gold and Charles M. Rader, *Digital Processing of Signals*, pp. 90–92, 1969.

*Primary Examiner*—Gary V. Harkcom
*Assistant Examiner*—Dale M. Shaw
*Attorney, Agent, or Firm*—Hamilton, Brook, Smith & Reynolds

[57] ABSTRACT

In-phase and quadrature components of a waveform are generated by sampling the waveform at a rate of four times the center frequency of the frequency band for which components are generated. The samples are digitized and applied to a digital 90° all-pass phase-splitting network. Each pair of output samples is generated as a function of input samples delayed by an even number of time instants through a first all-pass branch and delayed by an odd number of time instants through a second all-pass branch. A common network may form both branches by switching coefficients of a multiplier and alternating the output between in-phase and quadrature samples. The waveform may be shifted from a higher freqeuncy by a mixer and may be filtered prior to sampling.

26 Claims, 5 Drawing Sheets

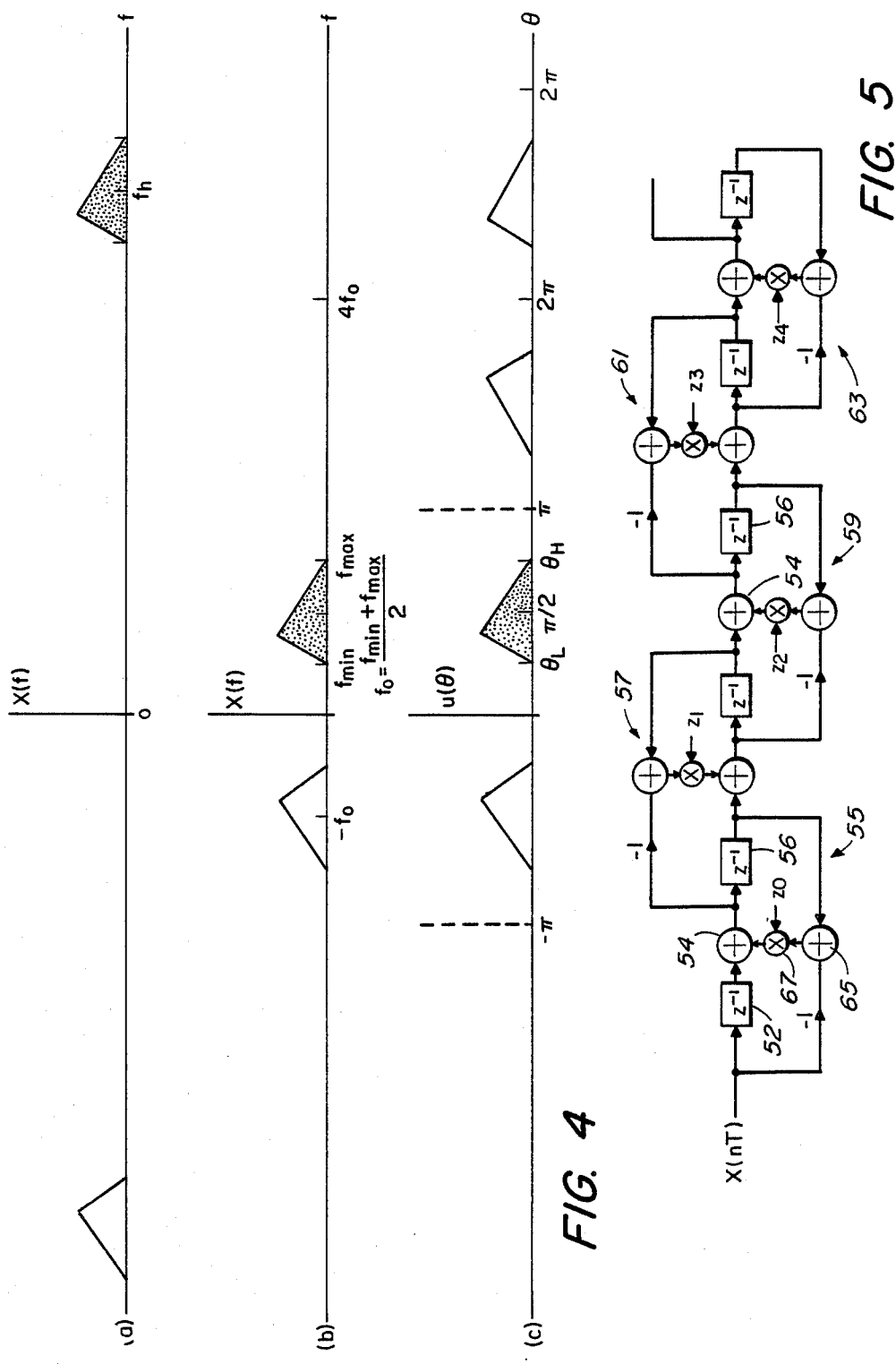

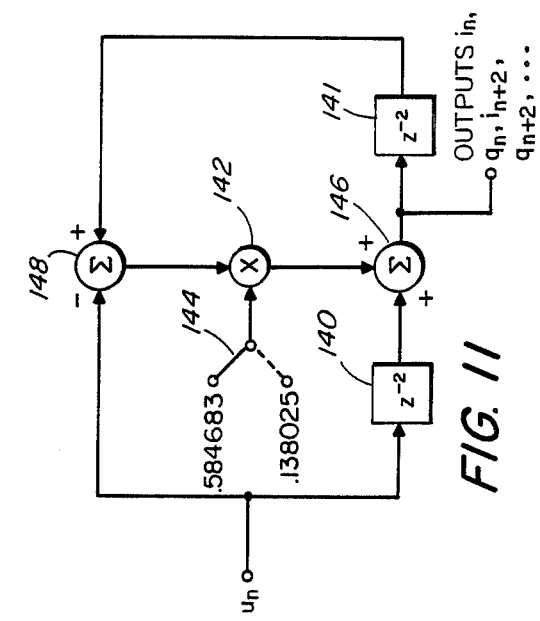
FIG. 11
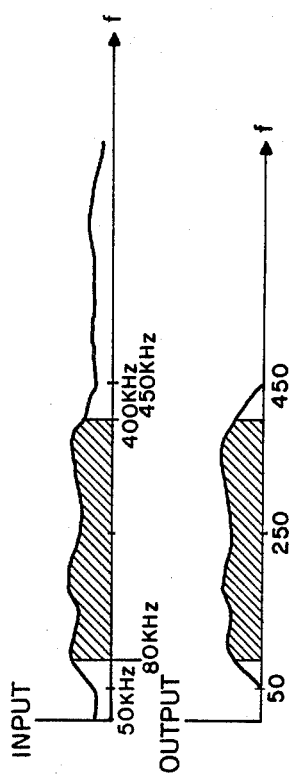
FIG. 12a
FIG. 12b
FIG. 12c
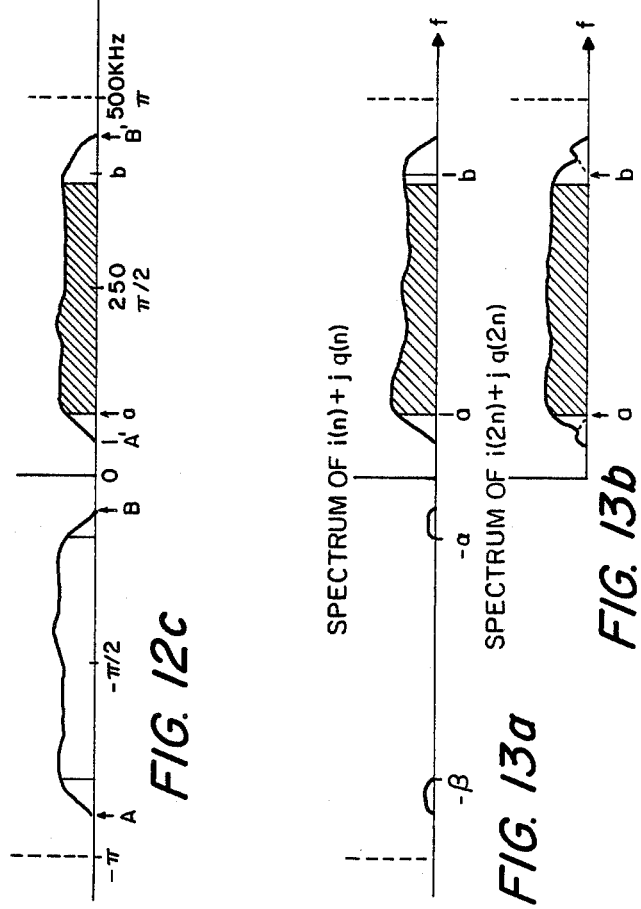
FIG. 13a
FIG. 13b

METHOD AND APPARATUS FOR SAMPLING IN-PHASE AND QUADRATURE COMPONENTS

DESCRIPTION

The Government has rights in this invention pursuant to Contract Number F19628-83-C-0002 awarded by the Department of the Air Force.

TECHNICAL FIELD

The present invention relates to information processing and in particular to systems in which an analog signal is sampled and in which in-phase and quadrature signals are generated.

BACKGROUND

An important problem in radar, in sonar and in some communications systems is to develop samples of baseband in-phase and quadrature components of a given band-limited RF waveform. For example, any real signal can be considered to be the sum of a pair of complex signals, each complex signal being in the form $s(t)=s_i(t)+js_q(t)$, with one complex signal having only positive frequency components and the other having only negative frequency components. One use of in-phase and quadrature components of a signal is to reduce the bandwidth which includes both positive and negative complex sidebands of a signal. A single sideband of the signal, that is the complex function of either positive or negative frequency components, can be suppressed as the other is frequency shifted to a dc baseband. The single remaining sideband, being a complex function, is defined in terms of in-phase and quadrature components of the initial band-limited waveform.

FIG. 1 illustrates the usual means by which in-phase and quadrature samples are produced. The spectra of two waveforms in the circuit are illustrated in FIG. 2. According to the Nyquist theorem, if a waveform whose Fourier transform is X(f) is band-limited such that there are no frequency components above a frequency w or below the frequency $-w$, the waveform can be entirely reconstructed from samples taken from the original waveform at a rate of at least 2w. In order to reduce the sampling rate required, a single sideband of a high frequency band-limited signal is conventionally shifted to the DC level as shown in FIG. 2B as the other is suppressed so that the waveform becomes band-limited within the frequencies $-w_2$ and $w_2$. When sampled, the sampled waveform spectrum is repeated periodically at a frequency equal to the sampling frequency as shown in FIG. 2C. It can be seen from a comparison of FIGS. 2B and 2C that so long as the sampling rate is at least as great as the bandwidth of the signal, that is $2w_2$, the center segment of the spectrum remains without overlap in the sampled spectrum and can be reconstructed by means of low pass filtering.

As shown in FIG. 2A, the original signal includes two sidebands centered at positive frequency $f_h$ and negative frequency $-f_h$. The circuit of FIG. 1 is used to shift the upper sideband centered at $f_h$ to the baseband and to filter the lower sideband. Because the intended output of the circuit has a spectrum which is non-symmetric about zero frequency, the output must be complex. In the circuit of FIG. 1, the input x(t) having a spectrum X(f) centered at $f_h$ is applied to separate multipliers 22 and 24. The multipliers are conceptually like a complex multiplier whose fixed input is $e^{-j2\pi f_h t}$; therefore, in the complex output $s(t)=s_i(t)+js_q(t)$, what had been the upper sideband of x(t) becomes centered at dc. The negative frequencies of x(t) become double-frequency terms and are removed by the low pass filters 26, 28. Therefore, s(t) has components only for $-B/2<f<B/2$ and, according to the Nyquist theorem, it may be sampled by sampling circuits 30, 32 with at least B complex samples per second to obtain a fully recoverable signal. The sampled signals are converted to digital samples by analog to digital converters 34, 36. The resultant spectrum Y(f) is a periodic signal of a period equal to the sampling frequency. In the following discussion the ideal realization of FIG. 1 will be taken as defining $y_n=i_n+jq_n$, the desired in-phase and quadrature components.

FIG. 1 shows how non-ideal circuits can lead to a mismatch between $i_n$ and $q_n$. It is often difficult to match the gains, phases and frequency responses of the two analog circuit chains which produce these two components.

DISCLOSURE OF THE INVENTION

In accordance with the present invention, a band-pass waveform centered at frequency $f_o$ is sampled by a single sampling circuit and digitized. If necessary, the signal centered at $f_o$ may be obtained by a single mixer and associated filters. The waveform is sampled at a frequency $4f_o$ and digitized. The in-phase and quadrature components, considered as real and imaginary parts of a single complex sampled waveform, are obtained as the output of a digital filter which suppresses one sideband. The in-phase and quadrature components, treated as two separate real sampled waveforms, are obtained as the outputs of the two branches of an all-pass phase splitting network in which the phase difference of the two branches approximates 90° for the frequencies to be preserved in the complex sampled waveform. The digital filter network is designed such that its frequency response is symmetric about the frequency $f_o$. As a result, for an odd order network, the z-transform poles of each all-pass filter branch are symmetric about the imaginary axis of the z-plane and one all-pass filter branch has a pole at zero. The z-transform transfer functions of the filter branches assume the form $$\prod_i \left( \frac{z^{-2} - z_i^2}{1 - z_i^2 z^{-2}} \right)$$

Positive $z_i$ in $I_b$ and $$z^{-1} \prod_i \left( \frac{z^2 - z_i^2}{1 - z_i^2 z^{-2}} \right)$$

Positive $z_i$ in $I_a$

Thus, each pair of output samples is generated as a function of input samples delayed by an even number of time instants through the first all-pass filter branch and by an odd number of time instants through the second all-pass filter branch, and the number of components in each branch can be substantially reduced.

Computation in the two filter branches can be reduced by alternately generating the two components of each pair of in-phase and quadrature components from alternate input samples. In one implementation, the first and second branches comprise a common network having double delays and alternating multiplier coefficients. In another implementation, sequential input samples are alternately applied to alternate all-pass filter branches such that the samples are applied to each branch at a frequency of $2f_o$.

By assuring that the center frequency $f_o$ is at least equal to the band width of the waveform for which in-phase and quadrature components are obtained, the number of output samples which must be retained can be further reduced by a factor of two without aliasing.

In a preferred implementation of the invention, the digital filter is a single network having a single multiplier for serving the function of a fifth order network. It comprises a first delay for delaying each input sample two time instants. A first summer has the output of the first delay as one input and alternately generates in-phase and quadrature components of sample pairs. A second delay delays each output of the first summer two time instants, and a second summer sums each input sample with the output of the second delay. A multiplier generates the product of the output of the second summer and a multiplying coefficient, and the product is applied as the second input to the first summer. Means is provided for alternating the multiplying coefficient of the multiplier with alternating generation of in-phase and quadrature components.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed on illustrating the principles of the invention.

FIGS. 4a–4c are a set of possible amplitude spectra for the circuit of FIG. 3.

FIG. 5 is a block diagram of one example of a branch of a conventional 90° phase splitter network.

FIG. 11 is an illustration of an alternative phase splitter network using common circuit components for the two branches.

FIGS. 12a–12c are the waveform spectra for a particular application of the present invention.

FIGS. 13a and 13b are a waveform spectra for another application of the present invention.

DESCRIPTION OF PREFERRED EMBODIMENTS

Figure 3:
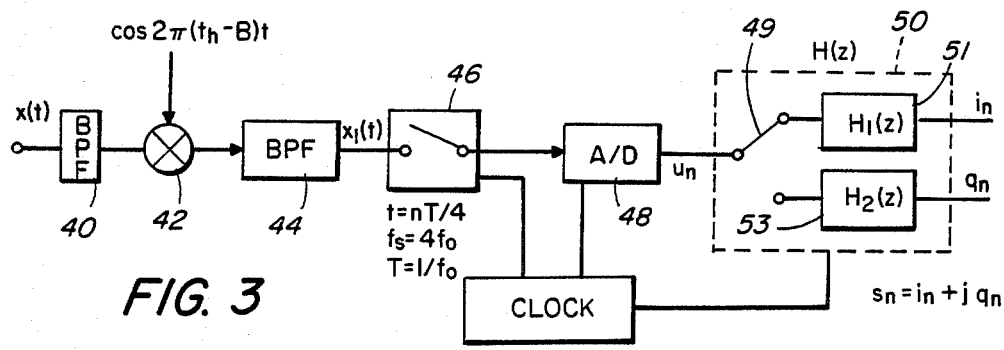
FIG. 3 is a block diagram illustrating a circuit embodying the present invention for developing in-phase and quadrature samples.

A system embodying the present invention and its associated waveforms are illustrated in FIGS. 3 and 4. The signal x(t) is first band-limited about frequencies centered on $f_h$ by a band-pass filter 40. That signal is then applied to a mixer 42 which shifts the waveform toward but not to zero frequency. Because a single mixer is used, both the positive and the negative frequencies are shifted toward zero frequency to frequencies $f_o$ and $-f_o$. In a preferred application, the frequency $f_o$ is selected to match the bandwidth B of each sideband, but such is not necessarily the case. The frequency shifted waveforms may then be applied to an additional band-pass filter 44 which removes components at $\pm(2f_h-f_o)$ and any stray dc components from the mixer and provides the signal $x_1(t)$.

The filter output is applied to a sampling circuit which may be a sample and hold circuit 46. In accordance with the present invention, the signal $x_1(t)$ is sampled at a rate equal to $4f_o$. The single sequence of samples is applied to an analog to digital converter 48 which generates the digitized sequence $u_n$. The in-phase and quadrature samples are then generated by means of a digital filter 50.

Because only every other sample of the digital filter output is needed, and because the invention does not require explicit computation of the unneeded samples, a switch 49 may be used to direct those input samples needed for computing required samples of $i_n$ to an all-pass digital filter 51 and to direct those other input samples needed for computing the required samples of $q_n$ to another all-pass digital filter 53.

The function of the filters 40 and 44 and the mixer 42 is to provide a signal of a band of frequencies which can be sampled without aliasing and which can be readily handled by the digital filter 50 to suppress one sideband and to retain another sideband without attenuation. As will be described below, the digital filter is designed to provide a 90° phase difference between its outputs for a frequency range from $f_{min}$ to $f_{max}$. The signal $x_1(t)$ is sampled at a sampling rate of $4f_0$ where $f_0=(f_{min}+f_{max})/2$. The signal $x_1(t)$ must be sufficiently band limited to prevent aliasing, that is overlap of adjacent segments of the sampled spectrum in the band of frequencies for which in-phase and quadrature components are required. Further, in a preferred implementation of the invention, complex samples are retained only at the rate of $2f_0$. Thus, aliasing may result between a partially suppressed sideband and the retained sideband. By confining the signal $x_1(t)$ substantially without the frequency range $f_{min}$ to $f_{max}$, the digital filter can be simplified by easing its design requirements for suppressing the stop band. The selection of the center frequency $f_o$ must balance the need for minimizing the sampling frequency $f_s=4f_o$ and the need for maintaining a transition region for the digital filter below $f_{min}$. Where a steep transition is required of the digital filter because of an $f_{min}$ close to zero, a higher order and thus more complex digital filter must be provided.

It will be recognized that either of the filters 40, 44 or the mixer 42 may be omitted if the input x(t) could be suitably confined to an acceptable frequency range about an acceptable frequency $f_o$ with one or more of the circuit elements.

In describing the frequency content of the sampled data sequence $u_n$, or of any other sampled data sequence, it is customary to use the normalized frequency unit of radians per sample, a dimensionless unit. For example, if $x_1(t)$ has a frequency component whose frequency is f, then the sequence $u_n$ has an equivalent component whose normalized frequency $\theta$ is $2\pi f/f_s$, which in the present invention is $2\pi f/4f_o$. By way of further explanation, the center frequency $f_o$, of the band of frequencies permitted in $x_1(t)$ is equivalent to the normalized frequency $\pi/2$ for the sequence $u_n$. Normalized frequencies which differ by any multiple of $2\pi$ radians per sample represent frequency components which are indistinguishable, so normally one considers that any frequency component at a normalized frequency is repeated at an infinite number of other normalized frequencies greater or smaller by multiples of $2\pi$.

The digital filter H(z) eliminates the negative frequency sideband of $u_n$ while retaining the positive (shaded) frequency sideband. (Alternatively, the positive frequencies could be suppressed and negative frequencies retained.) This means that the filter output $s_n$ must be complex. This is shown in FIG. 3 as two real filters. The specification required can be deduced from FIG. 4:

$$|H(e^{j\theta})| \simeq \text{constant} \quad \theta_L = \frac{f_{min}}{f_o} \frac{\pi}{2} < \theta < \frac{f_{max}}{f_o} \frac{\pi}{2} = \theta_H$$

$$|H(e^{j\theta})| \simeq 0 \quad -\theta_H < \theta < -\theta_L$$

Let the input sequence be $u_n$ with z-transform U(z) and digital fourier transform $U(e^{j\theta})$. Let $H_1(z)$ and $H_2(z)$ be the transfer functions of any two digital filters. Then the two outputs will have z-transforms $U(z)H_1(z)$ and $U(z)H_2(z)$. But if the two outputs are treated as real and imaginary parts of one complex sequence this sequence has z-transforms $$U(z)[H_1(z)+jH_2(z)]$$

where $j=\sqrt{-1}$.
Therefore the transfer function of the composite digital filter is $$H(z)=H_1(z)+jH_2(z)$$

Now suppose $H_1(z)$ and $H_2(z)$ are a pair of all-pass phase splitting digital filters. Then $H_2(e^{j\theta})=H_1(e^{j\theta})e^{j\phi(\theta)}$ where $\theta$ is the normalized frequency in radians per sample and $\phi$ is the phase difference between the filter outputs. Therefore the digital frequency response of the composite filter is $H_1(e^{j\theta})(1+je^{j\phi(\theta)})$ and its magnitude is $|1+je^{j\phi(\theta)}|$.

If $H_1$ and $H_2$ are a 90° phase splitting pair, there is a range of normalized frequencies $\theta_L < \theta < \theta_H$ for which $\phi(\theta) \simeq \pi/2$ and, necessarily, an opposite range $-\theta_H < -\theta < -\theta_L$ for which $\phi(\theta) \simeq -\pi/2$. The stop band and pass band of the filter are respectively the bands in which the phase splitter phase difference approximates ±90°. If the phase difference is allowed to deviate from 90° through the pass band and stop band by a small error no more than $\epsilon$, the pass band gain of H(z) is almost precisely 2 while the stop band gain is no greater than $\sin \epsilon$. The stop band attenuation can be made as large as desired by choice of $\epsilon$.

The procedure for designing such all-pass phase splitting networks is presented by Gold and Rader in *Digital Processing of Signals*, pp. 90–92, McGraw Hill, 1969, as modified in the Newsletter of ASSP Society, June 1981, p. 3. According to that procedure, one begins with specifications $\theta_L$, $\theta_H$ and $\epsilon$ such that the phase difference $\phi(\theta)$ is required to satisfy $-\epsilon < \phi(\theta) - \pi/2 < \epsilon$ for $\theta_L < \theta < \theta_H$. That is, $\phi$ cannot deviate from $\pi/2$ more than $\epsilon$ through that range of $\theta$. The digital transfer functions of filters $H_1(z)$ and $H_2(z)$ are to be determined by determining N poles, $z_0, z_1, z_2$ - - - some of which are poles of $H_1(z)$ and some of which are poles of $H_2(z)$. If $I_a$ is the set of poles belonging to $H_a(z)$ and $I_b$ is the set of poles belonging to $H_b(z)$, then associate $H_a(z)$ with either $H_1(z)$ of $H_2(z)$, and $H_b(z)$ with the other, so that the phase difference $\Phi(z)$ approximates $\pi/2$ rather than $-\pi/2$.

The above referenced design technique finds the smallest number of poles N for which the specification can be met. The number of poles defines the order of the filter. The same design technique gives those poles $z_i$:

1. Set $k = \dfrac{\tan(\theta_L/2)}{\tan(\theta_H/2)}$

Set $k_1 = \left( \dfrac{1 - \tan(\epsilon/2)}{1 + \tan(\epsilon/2)} \right)^2$

2. Set $N_o = \dfrac{K'(k)K(k_1)}{K(k)K'(k_1)}$ where K and K' are complete elliptic integrals. The notation follows that in Whittaker and Watson, *Modern Analysis*, Cambridge University Press, New York, 1902.

3. Set N to the smallest integer not less than $N_o$.
4. Compute the N quantities $$P_i=(-\tan \theta_L/2)\text{sc}((4i+1)K'(k)/2N, k')$$

where i=o, 1, ... N−1, $k'=\sqrt{1-k^2}$ and sc (x, k) is a Jacobian elliptic function, again following the notation in Whittaker and Watson.

5. For negative $P_i$ compute the poles $z_i$ in set $I_a$ using $$z_i = \frac{1 + P_i}{1 - P_i}$$

For positive $P_i$ compute the poles $z_i$ in set $I_b$ using $$z_i = \frac{1 - P_i}{1 + P_i}$$

6. The z-transform transfer function of each the two filters are the product:

$$H_{a \text{ or } b}(z) = \pi \left( \frac{z^{-1} - z_i}{1 - z_i z^{-1}} \right) \quad (3)$$

$z_i$ in $I_a$ or $I_b$

From equation 3 it can be seen that all the poles and zeros can be put in reciprocal pairs. Therefore, the digital network is all-pass; its amplitude response is substantially constant for all frequencies.

An example of one network which has the transfer function 3 is extended from that in Gold and Rader and shown in FIG. 5. The particular network shown is a fifth order network, that is it has five poles and would serve as a single branch of the digital all-pass filter 50.

The fifth order network includes five stages 55, 57, 59, 61 and 63, and it can be seen that the network order can be decreased or increased by decreasing or increasing the number of stages. In each stage, an incoming sample is delayed one time period as indicated at 52 and then applied to a summer 54. The output of the summer is taken as the output of the stage and is also further delayed in a unit 56. The incoming sample is then subtracted from this further delayed sample at 65, and the sum is multiplied at 67 by a coefficient $z_0$ which is a pole of the transfer function. The product is applied as the second input to the summer 54. It can also be seen that the delay 56 is utilized by both the first stage and the second stage of the all-pass filter.

In accordance with principles of the present invention, specifications for $\theta_L$, $\theta_H$ of the digital filter are chosen so that $\theta_L = \pi - \theta_H$ and the filter passband is thus centered at $\pi/2$. It can be seen from FIG. 4C that $\pi/2$ in the Z-transform corresponds to the waveform center frequency $f_0$ due to the selection of a sampling frequency $4f_0$. This filter specification results in a set of poles $z_i$ such that for every $z_i$ in the set $-z_i$ is also in the set. Thus, the poles with the exception of a possible pole $z_i = 0$ must occur in pairs. Furthermore, when these poles are assigned to the two sets $I_a$, $I_b$ one finds that:

1. For even N, one pole of each pair is in set $I_a$ and the other is in set $I_b$. There is no pole $z_i = 0$.
2. For odd N, each pair of poles is assigned to either set $I_a$ or to set $I_b$. There is one unpaired pole $z_i = 0$ belonging to set $I_a$.

The present invention relates to case 2, where N is odd. Referring to the preceeding section, N can be forced to be odd in either of two ways:
(a) if N is even, change the specifications and try again.
(b) if N in step 3 is even, use the next higher odd integer as N.

Where N is odd the transfer function of equation (3) can be seen to include products of terms including both $z_i$ and $-z_i$. Inserting $+z_i$ in one term and $-z_i$ in another each such product is:

$$\left(\frac{z^{-1} - z_i}{1 - z_i z^{-1}}\right)\left(\frac{z^{-1} + z_i}{1 + z_i z^{-1}}\right) = \left(\frac{z^{-2} - z_i^2}{1 - z_i^2 z^{-2}}\right)$$

And the term for $z_i = 0$ becomes $$\left(\frac{z^{-1} - 0}{1 - 0 z^{-1}}\right) = z^{-1}$$

Figure 6:
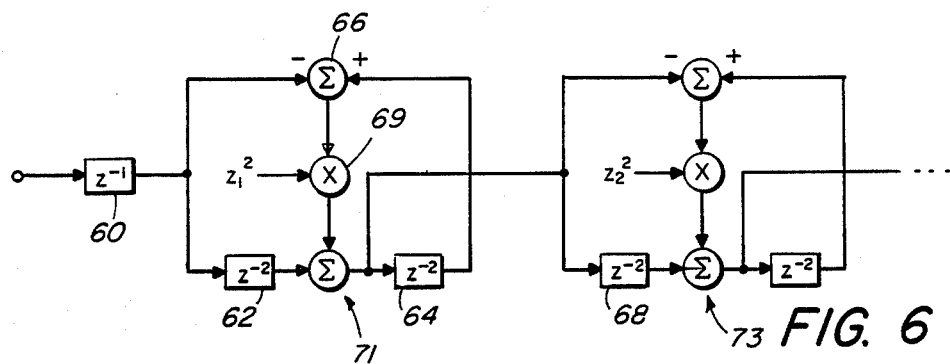
FIG. 6 is a block diagram of a branch of a 90° phase splitter network having reduced components in accordance with the present invention.

Thus the z-transform transfer functions for the two branches of the digital filter are $$H_a(z) = z^{-1} \pi \left(\frac{z^{-2} - z_i^2}{1 - z_i^2 z^{-2}}\right) \quad (4)$$
Positive $z_i$ in $I_a$ $$H_b(z) = \pi \left(\frac{z^{-2} - z_i^2}{1 - z_i^2 z^{-2}}\right) \quad (5)$$
Positive $z_i$ in $I_b$ There are many mathematically equivalent ways to realize a given transfer function as a digital filter. For the transfer function of equation 4 a possible implementation is shown in FIG. 6. It can be noted that the network includes a single delay 60 associated with the pole $z = 0$ and two double delays 62 and 64 in each subsequent stage 71, 73. Each subsequent stage also includes a single multiplier 69 for multiplying the sum of a summer 66 with the square of the calculated pole value. The particular network of FIG. 6 serves the function of a fifth order branch of an overall ninth order phase splitting network. The network used to implement the transfer function of equation 5 would be of the same form as that shown in FIG. 6 without the single delay 60.

Figure 7:
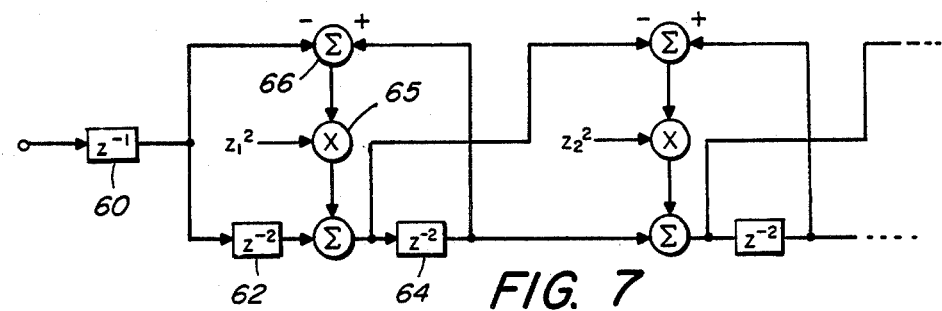
FIG. 7 is a block diagram of a circuit for performing the function of FIG. 6 but with fewer components.

It can be noted that the two double delays 64 and 68 in the network of FIG. 6 delay the same signal; therefore, they may be merged as shown in FIG. 7 using the single delay 64.

As an example of a network embodying the present invention, consider the example where $\theta_L = \pi/4 = 45°$, $\theta_H = 3\pi/4 = 135°$ and $\epsilon = 0.1145°$. The sum of $\theta_L$ and $\theta_H$ is $\pi$ so the passband is centered at $\pi/2$. From the above design technique, N is computed to equal 5 and the poles are approximately:

| $i_a$ | $i_b$ |
|---|---|
| +.76464 | −.37152 |
| 0 | +.37152 |
| −.76464 | |

The two transfer functions are:

$$H_1(z) = H_a(z) = z^{-1} \frac{z^{-2} - .5846832}{1 - .5846832 z^{-2}}$$

$$H_2(z) = H_b(z) = \frac{z^{-2} - .1380250}{1 - .1380250}$$

Figure 8:
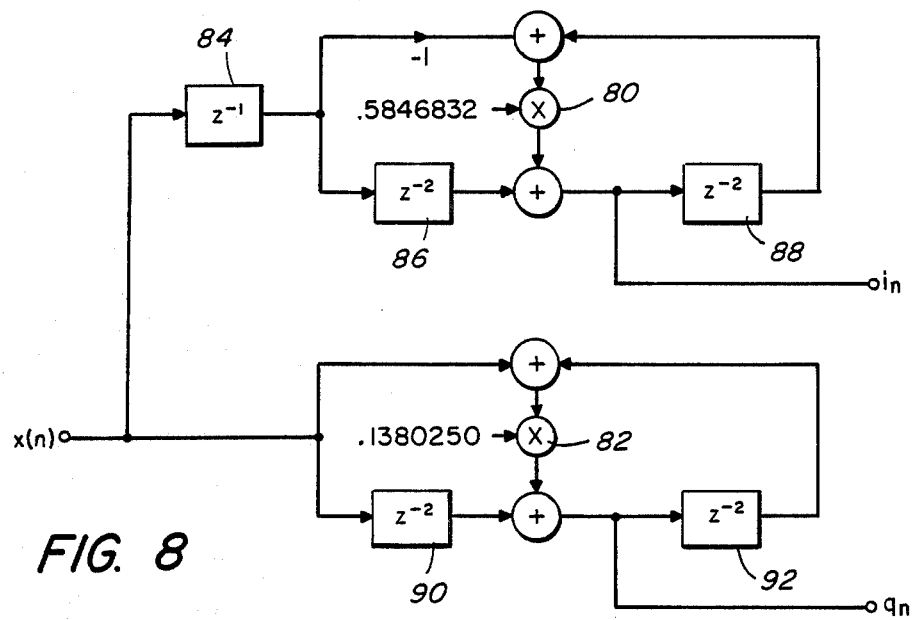
FIG. 8 is a block diagram of a fifth order phase splitter network embodying the present invention.

These transfer functions can be implemented by the fifth order network of FIG. 8 which includes only two multipliers 80 and 82. One branch of the network includes a single delay 84 and two double delays 86 and 88. The other branch includes two double delays 90 and 92.

It may be noted that the two fixed constant multipliers in this design may be approximated by $$0.5846832 \simeq \tfrac{1}{2}(1+2^{-5})(1+2^{-7})(1+2^{-3})$$

$$0.138025 \simeq (\tfrac{1}{8})(1+2^{-5})(1+2^{-7})(1+2^{-4})$$

so that each constant multiplication may be replaced by a set of additions and bit shifts with no more than three additions in place of each multiplication.

It is interesting to note the effect of changing $\theta_L$ to 46° and $\theta_H$ to 136° to thus make the filter design non-symmetric about $\pi/2$. In that case N=5 with poles of $H_a(z)$ as follows:

| $i_a$ | $i_b$ |
|---|---|
| +.75949 | −.38213 |
| −.01234 | +.36085 |
| −.76974 | |

Because the poles are no longer symmetric about zero, the transfer functions of equations 4 and 5 no longer apply. Rather, the transfer function of equation 3 and a more complicated network must be utilized. The result, for a fifth order network, is the need for five multiplications and the use of single delays.

A ninth order network embodying the present invention can be illustrated by the following:

$\theta_L = 20°; \theta_H = 160°; \epsilon = 0.05°$

Calculate N=9. The poles of $H_a$ and $H_b$ are approximately

| $I_a$ | $I_b$ |
|---|---|
| ±.90809 | ±.72576 |
| 0 | |
| ±.51833 | ±.27297 |

The transfer functions are:

$$H_1(z) = H_a(z) = z^{-1}\left(\frac{z^{-2} - .824624}{1 - .824624z^{-2}}\right)\left(\frac{z^{-2} - .268663}{1 - .268663z^{-2}}\right)$$

$$H_2(z) = H_b(z) = \left(\frac{z^{-2} - .526728}{1 - .526728z^{-2}}\right)\left(\frac{z^{-2} - .074515}{1 - .074515z^{-2}}\right)$$

Figure 9:
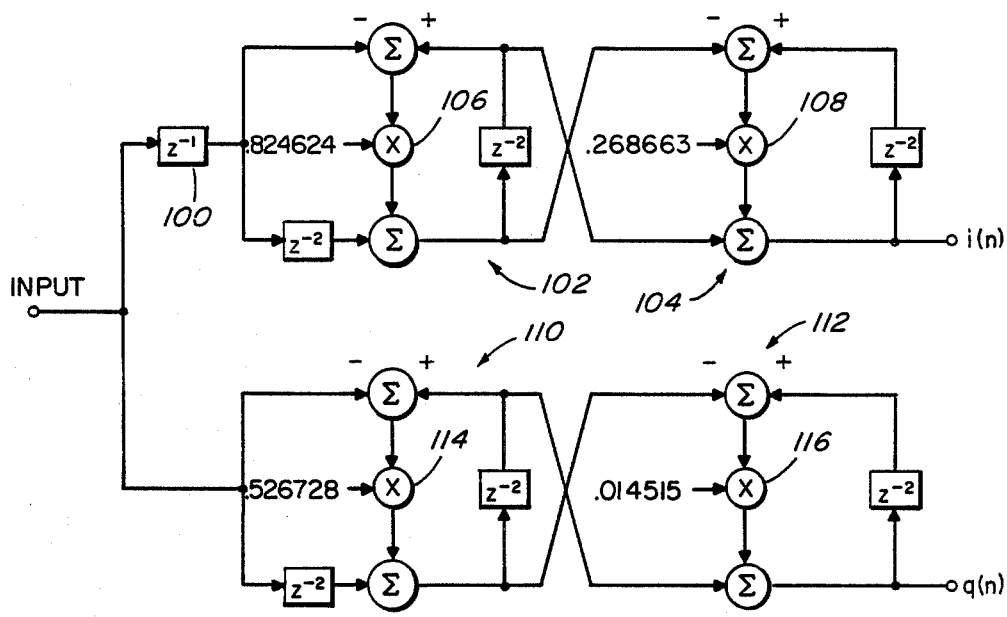
FIG. 9 is a block diagram of a ninth order phase splitter network embodying the invention.

These transfer functions can be implemented by the network of FIG. 9. One branch includes three stages including the single delay 100 and second and third stages 102 and 104. Each of the stages 102 and 104 includes a single multiplier 106, 108. The other branch includes two stages 110, 112, each including a single multiplier 114, 116. Thus, a ninth order network is obtained with only four multipliers. In general, the number of multipliers required in an Nth order network is half of N−1.

Figure 10:
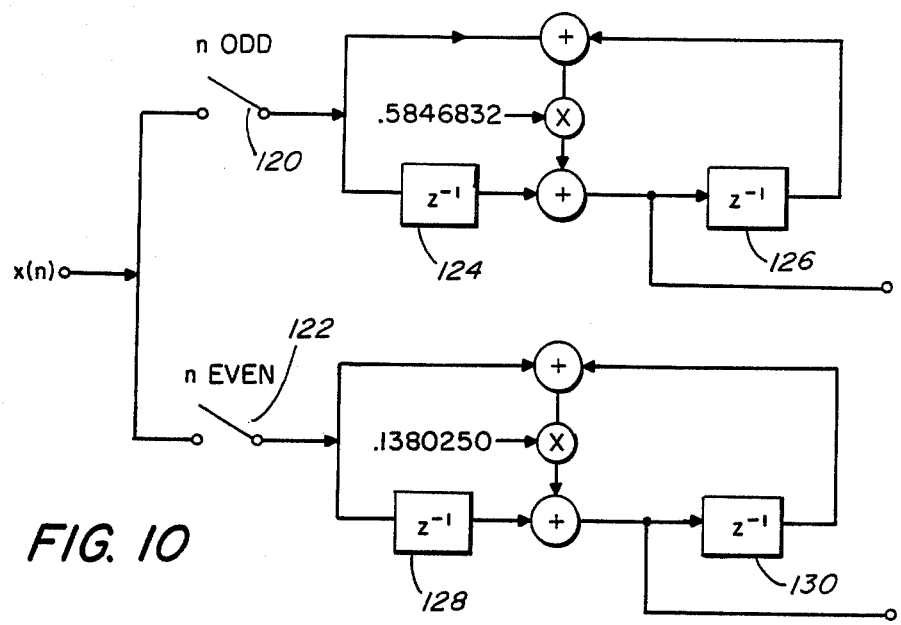
FIG. 10 is an illustration of a fifth order network similar to that of FIG. 8 but in which samples are applied to respective branches alternately so that each can be run at a reduced rate.

With reference to FIG. 8, for example, it can readily be seen that, of each pair of samples i, q output from the network, the sample i is computed from input samples delayed by an odd number of time delays and the q sample is calculated from input samples delayed by an even number of time delays. If one then only considers only the even numbered samples of the $4f_o$ samples output from the network, it can be seen that those even numbered samples of i depend only on odd number samples of the input x, while even numbered samples of q depend only on even numbered samples of x. Therefore, by reducing the number of system outputs to a rate of $2f_o$, the circuit of FIG. 8 can be replaced by the circuit of FIG. 10. The incoming samples x are alternately switched to the two branches. The delay 84 of FIG. 8 is obtained by the switches 120, 122 and by the proper pairing of outputs $i_n$ and $q_n$ with one another. Further, because the signals are applied to the respective branches at half the rate, the double delays 86, 88, 90 and 92 can be replaced by single delays 124, 126, 128, 130. The effect of the single delays in combination with the input switches 120 and 122 is a double delay at each delay unit. It is important, when pairing outputs $i_n + jq_n$, that the output of the odd order network (top branch of FIG. 10) for a given input sample $u_n$ must be paired with the output of the even order network (bottom branch of FIG. 10) for the next input sample $u_{n+1}$. With $i_n$ of the present example thus paired with a $q_n$ calculated in a subsequent time, the net effect is that $i_n$ and $q_n$ of the pair are respectively based on input samples delayed by odd and even numbers of time instants.

The reduction in the rate of the output samples to $2f_o$ does not produce significant aliasing because one side band is substantially eliminated in the complex signal.

The implications of this system are as follows:

1. A filter section which implements the poles $z_i$ and $-z_i$, that is poles symmetric about zero, and corresponding zeros $1/z_i$, $-1/z_i$, can be realized with only one multiplication.

2. Since $H_b(z)$ is a function of $z^{-2}$ it has no single delays, only double delays. Therefore the output of the "b" network at sampling instant n depends only on inputs from sampling instants n, n−2, n−4, . . . . Similarly, $H_a(z)$ is of the same form except for the single delay $z^{-1}$ so the output of the "a" network depends only on inputs from sampling instants n−1, n−3, n−5, . . . .

Thus, if half of the outputs from each branch can be eliminated, half of the computations can also be eliminated. In comparing the system of FIG. 10 with a conventional fifth order network implemented according to FIG. 5, it can be seen that in the latter each input must be processed in each branch even if only half of the outputs are required because each output is based on input samples which are delayed only by single delays. Therefore, the present design leads to a realization requiring two multiplications per output which may be run for every second output. If the prescription of the invention that $\theta_H + \theta_L = \pi$ had not been followed, an implementation would have required five multiplications per output and must have been run for every output even if alternate outputs were not needed. Thus, the present design is five times less costly in the number of computations required.

FIG. 11 illustrates how common networks can be used for the two branches of the filter 50. Because the branches operate on alternating samples, simultaneous use of the multiplier is not required. As shown in FIG. 11 every input sample is processed using double delays 140, 141. The coefficient applied to the multiplier 142 for operating in respective branches can be alternated by a switch 144. A single set of summers 146, 148 is used for both branches. Odd numbered output samples can then be taken as samples of i(n) and the next even numbered samples can be taken as samples of q(n). As with the embodiment of FIG. 10, the pairing of one output with an output that lags by one cycle provides the single delay 84 of FIG. 8. In this preferred embodiment, a single multiplier, two summers and two double delays function as a fifth order phase splitting network.

Another example of the invention can be illustrated by the following:

Suppose the signal of interest lies between 80 KHz and 400 KHz and that there is also much extraneous noise in other bands. Further suppose that it is practical to design an analog filter which passes 80 to 400 KHz with minimal distortion but attenuates below 50 KHz and above 450 KHz to an adequate degree. Put the signal into this filter and designate the center frequency of the filter output as 250 KHz. FIGS. 12a and b give the cartoon spectra of input and output of the filter.

When this is sampled at 4×250 MHz the resulting digital sequence has digital spectra as shown in FIG. 12c, periodically repeated beyond $\pi$ and $-\pi$.

If the sampling rate were to be halved, the spectrum from A to B would "alias" with the range A' and B'. Aliasing can be avoided entirely by attenuating the negative frequencies before halving the sampling rate. The digital filter to be illustrated passes $\theta_L$ to $\theta_H$ where $\theta_L = 2\pi$  50  KHz/1  MHz = 0.1 = 18° and $\theta_H = 0.9\pi = 162°$. Suppose the specification sets $\epsilon = 0.1145°$ which gives 60 dB attenuation of the negative frequencies relative to the positive frequencies.

A straightforward design gives N=8 which is even, hence not suitable. By reducing $\epsilon$ to 0.09° (or simply letting N=9) the poles are:

| $I_a$ | $I_b$ |
|---|---|
| ±.91346 | ±.7384 |
| ±.53276 | ±.2826 |
| 0 | |

The resulting $H_1(z)$ and $H_2(z)$ are $$H_1(z) = z^{-1}\left(\frac{z^{-2} - .91346^2}{1 - .91346^2 z^{-2}}\right)\left(\frac{z^{-2} - .53276^2}{1 - .53276^2 z^{-2}}\right)$$

$$H_2(z) = \left(\frac{z^{-2} - .7384^2}{1 - .7384^2 z^{-2}}\right)\left(\frac{z^{-2} - .2826^2}{1 - .2826^2 z^{-2}}\right)$$

The network of the form given in the ninth order case above (FIG. 9) can be used, but with coefficients from this example. There are inputs every microsecond but outputs i(n)+jq(n) are computed half as often using just 4 multiplications and 8 additions in 2 microseconds.

Suppose one is willing to allow aliasing in the output i+jq as long as it does not alias the shaded spectrum. Then the revised passband must be from a to b in FIG. 12c. "b" is not at the edge of the band because band edge symmetry must be maintained about $\pi/2$. Then $\theta_L = 2\pi a/1$ MHz$=28.8°$. Letting $\epsilon = 0.1145°$ our revised design gives N=7 so that the 60 dB specification can now be met with one fewer multiplication and two fewer additions every 2 microseconds. In FIG. 13a the cartoon spectrum of the digital filter output is shown with every sample computed. In FIG. 13b the cartoon spectrum with every other sample computed is shown.

It can be seen from the above and from FIG. 4 that if the center frequency $f_0$ is selected to be equal to or greater than the bandwidth B of the waveform, the number of samples required in the output can be reduced again by a factor of 2. However, the full $2f_0$ inputs are required to each branch for purposes of computation of the output. Thus, to provide the $f_0$ complex output samples, $2f_0$ samples must be applied to each branch and as those are odd and even samples a total of $4f_0$ samples must be taken by the sample and hold circuit 46 of FIG. 3.

To compare the method proposed here with the conventional approach, only one mixer is required and all requirements for matching between two circuit chains are eliminated. The price paid is four times faster sampling and, for the fifth order example, multiplications, additions and subtractions at the rate of 4B. Although the A/D converter required must be faster, only one is required rather than two. The design requires the passband to be symmetrical about $\theta = \pi/2$ and the stopband to be symmetrical about $-\pi/2$, but there is nothing critical about band edges. Therefore, guard bands may be provided leading to slightly different parameters without changing the form of the networks.

Figure 1:
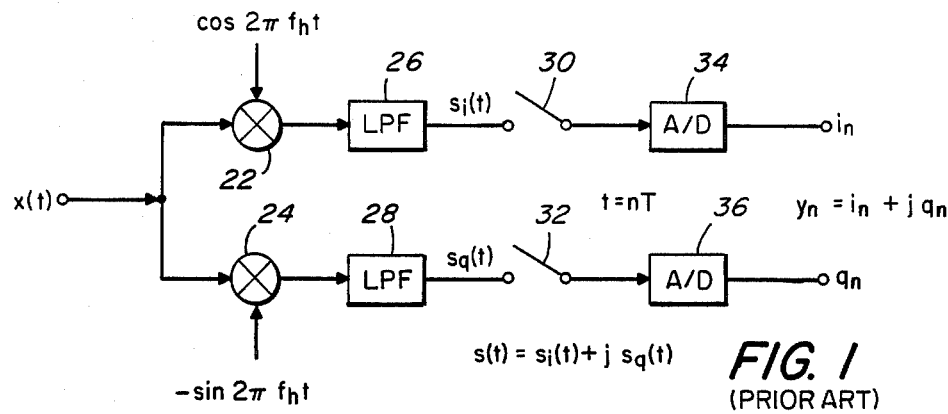
FIG. 1 is a block diagram of a prior art circuit for developing in-phase and quadrature samples.

It may be important to note that $s_n$ in FIG. 3 is not quite the same as $y_n$ in FIG. 1. This is because there has been no account for the phase response of H(z). For the fifth order example with $f_0 = B$, there is a nominal delay of about 1.75 sample times at the $4f_0$ sampling rate over the range of frequencies of the sideband. However, this delay as a function of frequency deviates from nominal by less than $\pm\frac{1}{4}$ sample at the $4f_0$ sampling rate. This is believed to be negligible; if not, for some systems it may be practical to compensate for the variation in phase vs. frequency in the design of the front end. Compensation for the nominal delay is seldom an issue.

For all the signals described with respect to this invention which are sequences represented digitally, and for all the processes of digital filtering in this invention, it is necessary to recognize that the physical embodiments of the networks and signals have no necessary form resembling any of the diagrams, but that the diagrams represent only algorithmic relationship which might be embodied by physical circuits, programmable circuits, multiplexed computational elements and memory components, and so on. Further, as is conventional in describing a digitized sequence, "time" refers strictly to the consecutive numbering of samples comprising the sequence and "delay" refers strictly to the correspondence of samples of one sequence to samples of another sequence, and neither term has any necessary relationship with the clock time at which any computations take place.

While the invention has been particularly shown and described with reference to preferred embodiments thereof, it will be understood by those skilled in the art that various changes in form and details may be made therein without departing from the spirit and scope of the invention as defined by the appended claims.

I claim:

1. Electronic apparatus for providing, as pairs of output samples, samples of in-phase and quadrature components of a waveform comprising:
   sampling means for generating samples by sampling the waveform at equally spaced time instants;
   digitizing means for digitizing each of the samples; and
   a digital phase-splitting network having the digitized samples as an input, each pair of output samples being generated such that one component of the pair is a function of only input samples delayed by an even number of time instants and the other component is a function of only input samples delayed by an odd number of time instants.

2. Electronic apparatus as claimed in claim 1 wherein the digital phase splitting network comprises two allpass filter branches formed by a common network having delays of two time instants each and having means for alternatingly supplying coefficients of the in-phase and quadrature components to a multiplying means in generating the in-phase and quadrature components.

3. Electronic apparatus as claimed in claim 1 wherein sequential input samples are alternately applied as inputs to alternate all-pass filter branches.

4. Electronic apparatus as claimed in claim 1 wherein the center frequency $f_o$ of a band of frequencies for which the in-phase quadrature components are obtained is at least equal to the bandwidth of the band of frequencies.

5. Electronic apparatus as claimed in claim 1 further comprising frequency shifting means for shifting a bandpass waveform from a higher center frequency to the center frequency $f_o$ prior to sampling at a rate of $4f_o$.

6. Electronic apparatus as claimed in claim 5 further comprising filter means for removing frequency components outside of the band of frequencies for which the in-phase and quadrature components are obtained.

7. Electronic apparatus for providing pairs of samples of in-phase and quadrature components of a waveform comprising:
sampling means for generating samples by sampling the waveform at equally spaced time instants;
digitizing means for digitizing each of the samples; and
a digital all pass filter having the digitized samples as an input, the two component samples of each pair of in-phase and quadrature component samples being alternately generated from alternate input samples.

8. Electronic apparatus as claimed in claim 7 wherein the digital all-pass filter comprises a common network having delays of two time instants each and having means for alternatingly supplying coefficients of the in-phase and quadrature components to a multiplying means in generating the in-phase and quadrature components.

9. Electronic apparatus as claimed in claim 7 wherein sequential input samples are alternately applied as inputs to alternate all-pass filter branches.

10. Electronic apparatus as claimed in claim 7 wherein the center frequency $f_o$ of a band of frequencies for which the in-phase and quadrature components are obtained is at least equal to the bandwidth of the band of frequencies.

11. Electronic apparatus as claimed in claim 7 further comprising frequency shifting means for shifting a bandpass waveform from a higher center frequency to a center frequency $f_o$ prior to sampling at a rate of $4f_o$.

12. Electronic apparatus as claimed in claim 11 further comprising filter means for removing frequency components outside of the band of frequencies for which the in-phase and quadrature components are obtained.

13. Electronic apparatus for providing samples of in-phase and quadrature components of a waveform having a band of frequency components confined substantially to a frequency range of $f_{min}$ to $f_{max}$ having a center frequency $f_o$ comprising:
sampling means for generating samples by sampling the waveform at equally spaced time instants spaced by times $1/(4f_o)$;
digitizing means for digitizing each of the samples; and
a digital 90° phase-splitting network having the digitized samples as an input and comprising first and second digital all-pass filter branches having respective outputs, the phase difference of which approximates 90° for the band of frequencies $f_{min}$ to $f_{max}$, the z-transform poles of each all-pass filter branch being symmetric about the imaginary axis of the z-plane and one all-pass filter branch having a pole at zero.

14. Electronic apparatus for providing samples of in-phase and quadrature components of a waveform comprising:
sampling means for generating samples by sampling the waveform at equally spaced time instants;
digitizing means for digitizing each of the samples; and
a digital phase-splitting network having the digitized samples as an input and comprising first and second digital all-pass filter branches having respective outputs, the z-transform transfer functions of the all-pass filter branches being in the forms $$\pi_i \left( \frac{Z^{-2} - z_i^2}{1 - z_i^2 Z^{-2}} \right)$$

Positive $i$ in $I_b$ and $$Z^{-1} \pi_i \left( \frac{Z^{-2} - z_i^2}{1 - z_i^2 Z^{-2}} \right)$$

Positive $i$ in $I_a$.

15. Electronic apparatus for providing samples of in-phase and quadrature components of a waveform comprising:
sampling means for generating samples by sampling the waveforms at equally spaced time instants;
digitizing means for digitizing each of the samples; and
a digital all-pass network having the digitized samples as an input and comprising a first delay for delaying each input sample two time instants, a first summer having the output of the first delay as one input for alternately generating in-phase and quadrature components of sample pairs, a second delay for delaying each output of the first summer two time instants, a second summer for summing each input sample with the output of the second delay, a multiplier for generating the product of the output of the second summer and a multiplying coefficient, the product providing a second input to the first summer, and means for alternating the multiplying coefficient of the multiplier with generation of in-phase and quadrature components.

16. A method of providing, as pairs of output samples, in-phase and quadrature components of a waveform, the method comprising:
sampling the waveform at equally spaced time instants to generate a set of even samples spaced from an initial time by an even number of time instants and a set of odd samples spaced from said initial time by an odd number of time instants;
digitizing each of the samples; and
generating said pairs of output samples in a digital phase-splitting network such that one component of each pair is generated from only even samples and the other component is generated from only odd samples.

17. A method as claimed in claim 16 wherein the pairs of output samples are generated in a digital phase-splitting network comprising two all-pass filter branches formed by a common network, all delays in the all-pass filter branches being of two time instants each and a multiplying coefficient applied to the all-pass filter branches being alternated for alternately generating in-phase and quadrature components.

18. A method as claimed in claim 16 wherein sequential input samples are alternately applied as inputs to alternate all-pass filter branches.

19. A method as claimed in claim 16 wherein the center frequency $f_o$ of a band of frequencies for which the in-phase and quadrature components are obtained is at least equal to the bandwidth of the band of frequencies.

20. A method of providing pairs of samples of in-phase and quadrature components of a waveform comprising:
sampling the waveform;

digitizing each of the samples; and alternately generating the two component samples of each pair of in-phase and quadrature component samples from alternate input samples in a digital all-pass filter.

21. A method as claimed in claim 20 wherein the pairs of output samples are generated in a digital phase-splitting network comprising two all-pass filter branches formed by a common network, all delays in the all-pass filter branches being of two time instants each and a multiplying coefficient applied to the all-pass filter branches being alternated for alternately generating in-phase and quadrature components.

22. A method as claimed in claim 20 wherein sequential input samples are alternately applied as inputs to alternate all-pass filter branches.

23. A method as claimed in claim 20 wherein the center frequency $f_o$ of a band of frequencies for which the in-phase and quadrature components are obtained is at least equal to the bandwidth of the band of frequencies.

24. A method of providing samples of in-phase and quadrature components of a waveform having a band of frequency components confined substantially to a frequency range of $f_{min}$ to $f_{max}$ having a center frequency $f_o$ comprising:

sampling the waveform at equally spaced time instants spaced by times $1/(4f_o)$;

digitizing each of the samples; and generating in-phase and quadrature components in a digital 90° phase-splitting network having the digitized samples as an input and comprising first and second digital all-pass filter branches having respective outputs, the phase difference of which approximates 90° for the band of frequencies $f_{min}$ to $f_{max}$, the z-transform poles of each all-pass filter branch being symmetric about the imaginary axis of the z-plane and one all-pass filter branch having a pole at zero.

25. A method of providing samples of in-phase and quadrature components of a waveform comprising:

sampling the waveform at equally spaced time instants;

digitizing each of the samples; and generating in-phase and quadrature components in a digital phase-splitting network having the digitized samples as an input and comprising first and second digital all-pass filter branches having respective outputs, the z-transform transfer functions of the all-pass filter branches being in the forms $$\pi_i \left( \frac{Z^{-2} - z_i^2}{1 - z_i^2 Z^{-2}} \right)$$

Positive $i$ in $I_b$ and $$Z^{-1} \pi_i \left( \frac{Z^{-2} - z_i^2}{1 - z_i^2 Z^{-2}} \right)$$

Positive $i$ in $I_a$.

26. A method of providing samples of in-phase and quadrature components of a waveform comprising:

sampling the waveform at equally spaced time instants;

digitizing each of the samples; and delaying each input sample two time instants, summing the delayed input sample with a product for alternately generating in-phase and quadrature components of sample pairs, delaying each in-phase and quadrature component two time instants, summing each input sample with the delayed in-phase and quadrature components to generate a second summed output, and multiplying the second summed output with a multiplying coefficient to generate the aforementioned product, the multiplying coefficient being alternated with generation of in-phase and quadrature components.

* * * * *

UNITED STATES PATENT AND TRADEMARK OFFICE
CERTIFICATE OF CORRECTION

PATENT NO. : 4,794,556

DATED : Dec. 27, 1988

INVENTOR(S) : Charles M. Rader

It is certified that error appears in the above—identified patent and that said Letters Patent is hereby corrected as shown below:

In column 2, lines 47-49, the formula should appear as follows:

$$\prod_{\substack{positive\ z_i \\ in\ I_b}} \left(\frac{z^{-2} - z_i^2}{1 - z_i^2 z^{-2}}\right)$$

In column 2, lines 53-55, the formula should appear as follows:

$$z^{-1} \prod_{\substack{positive\ z_i \\ in\ I_a}} \left(\frac{z^{-2} - z_i^2}{1 - z_i^2 z^{-2}}\right)$$

In column 6, lines 55-58, formula (3) should appear as follows:

$$H_{a\ or\ b}(z) = \prod_{\substack{positive\ z_i \\ in\ I_a\ or\ I_b}} \left(\frac{z^{-1} - z_i}{1 - z_i z^{-1}}\right)$$

In column 7, lines 56-59, formula (4) should appear as follows:

$$H_a(z) = z^{-1} \prod_{\substack{positive\ z_i \\ in\ I_a}} \left(\frac{z^{-2} - z_i^2}{1 - z_i^2 z^{-2}}\right)$$

Also in column 7, lines 60-63, formula (5) should appear as follows:

$$H_b(z) = \prod_{\substack{positive\ z_i \\ in\ I_b}} \left(\frac{z^{-2} - z_i^2}{1 - z_i^2 z^{-2}}\right)$$

UNITED STATES PATENT AND TRADEMARK OFFICE
CERTIFICATE OF CORRECTION

PATENT NO. : 4,794,556
DATED : Dec. 27, 1988
INVENTOR(S) : Charles M. Rader

It is certified that error appears in the above—identified patent and that said Letters Patent is hereby corrected as shown below:

In column 8, line 47, the formula should appear:

$$0.138025 \simeq (\frac{1}{2})^3(1+2^{-5})(1+2^{-7})(1+2^{-4})$$

In column 10, line 58,

"4x250 MHz" should read ---4x250 KHz---

In column 10, line 66, the formula for $\theta_L$ should appear:

$$\theta_L = 2\pi \frac{50\ KHz}{1\ MHz} = 0.1\pi = 18°$$

In Claim 14, column 14, lines 2-5, the formula should appear:

$$\prod_{\substack{positive\ s_i \\ in\ I_b}} \left(\frac{z^{-2} - z_i^2}{1 - z_i^2 z^{-2}}\right)$$

In Claim 14, column 14, lines 8-11, the formula should appear:

$$z^{-1} \prod_{\substack{positive\ s_i \\ in\ I_a}} \left(\frac{z^{-2} - z_i^2}{1 - z_i^2 z^{-2}}\right)$$

In Claim 25, column 16, lines 13-16, the formula should appear:

$$\prod_{\substack{positive\ s_i \\ in\ I_b}} \left(\frac{z^{-2} - z_i^2}{1 - z_i^2 z^{-2}}\right)$$

UNITED STATES PATENT AND TRADEMARK OFFICE
CERTIFICATE OF CORRECTION

PATENT NO. : 4,794,556

DATED : Dec. 27, 1988

INVENTOR(S) : Charles M. Rader

It is certified that error appears in the above—identified patent and that said Letters Patent is hereby corrected as shown below:

In Claim 25, column 16, lines 19-22, the formula should appear:

$$z^{-1} \prod_{\substack{positive\ z_i \\ in\ I_a}} \left( \frac{z^{-2} - z_i^2}{1 - z_i^2 z^{-2}} \right)$$

Figure 2:
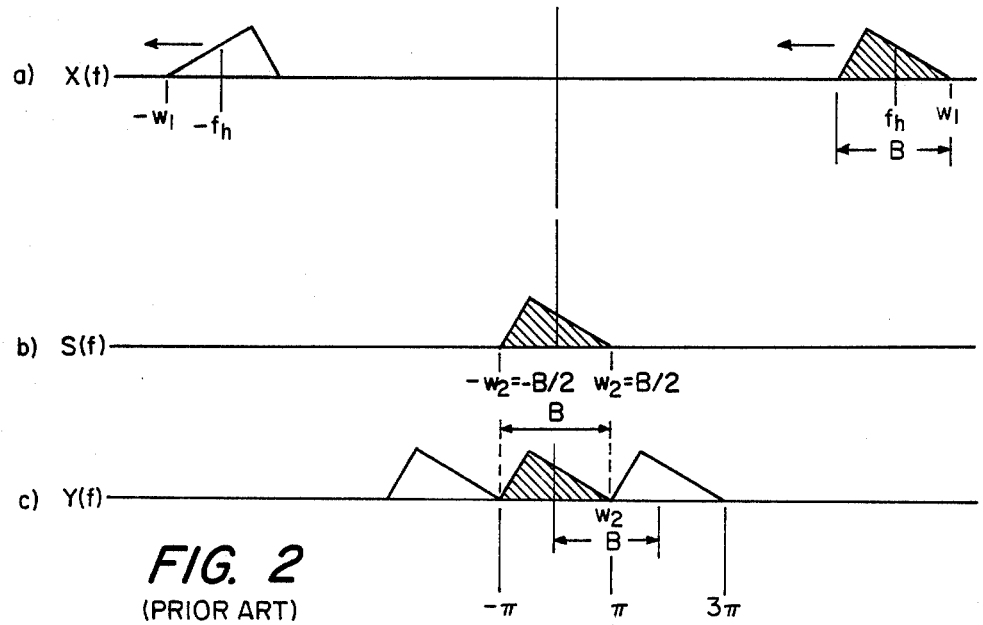
FIG. 2 is a set of possible amplitude spectra from the circuit of FIG. 1.

In Figure 2A, the label at the left end of the horizontal axis should read ---X(f)---.

In Figure 3, the signal applied to element 42 should read ---cos 2 ($f_h$-B)t---.

In Figure 5, the term "ZO" of stage 55 should read ---$Z_0$---.

In Figure 5, the term "Z3" of stage 61 should read ---$Z_3$---.

Signed and Sealed this

First Day of August, 1989

*Attest:*

DONALD J. QUIGG

*Attesting Officer*    *Commissioner of Patents and Trademarks*